US010374133B2

(12) United States Patent
Kaneko et al.

(10) Patent No.: US 10,374,133 B2
(45) Date of Patent: Aug. 6, 2019

(54) LIGHT EMITTING APPARATUS WITH TWO PRIMARY LIGHTING PEAKS

(71) Applicant: Sharp Kabushiki Kaisha, Sakai, Osaka (JP)

(72) Inventors: Kazuaki Kaneko, Sakai (JP); Hiroaki Onuma, Sakai (JP); Kiyoto Gotoh, Sakai (JP); Makoto Matsuda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/562,770

(22) PCT Filed: Mar. 30, 2016

(86) PCT No.: PCT/JP2016/060494
§ 371 (c)(1),
(2) Date: Sep. 28, 2017

(87) PCT Pub. No.: WO2015/159141
PCT Pub. Date: Oct. 6, 2016

(65) Prior Publication Data
US 2018/0358515 A1     Dec. 13, 2018

(30) Foreign Application Priority Data

Apr. 3, 2015   (JP) ................. 2015-076567

(51) Int. Cl.
*H01L 33/48*     (2010.01)
*H01L 33/50*     (2010.01)
(Continued)

(52) U.S. Cl.
CPC ........ *H01L 33/504* (2013.01); *H01L 25/0753* (2013.01); *H01L 33/486* (2013.01);
(Continued)

(58) Field of Classification Search
CPC . H01L 33/0486; H01L 33/504; H01L 33/509; H01L 33/62; H01L 33/50; H01L 33/54
(Continued)

(56) References Cited

U.S. PATENT DOCUMENTS 8,816,377 B2 *   8/2014   Toda ................. C09K 11/7792
                                                     252/301.4 R
9,351,371 B2 *   5/2016   Ishizaki ............... H01L 33/504
(Continued)

FOREIGN PATENT DOCUMENTS

JP     2006-303259 A     11/2006
JP     4072632 B2        4/2008
(Continued)

*Primary Examiner* — Alexander O Williams
(74) *Attorney, Agent, or Firm* — Birch, Stewart, Kolasch & Birch, LLP

(57) ABSTRACT

A light emitting apparatus that includes at least one kind of light emitting elements of which the number is one or more, and a phosphor that is excited by output light of the light emitting element. In a case where all light emitting elements mounted before the phosphor is mounted in the light emitting apparatus emit light, the light emitting apparatus has a peak wavelength of output light in a first wavelength region of 440 nm or longer and shorter than 460 nm, and has a peak wavelength of output light in a second wavelength region of 460 nm to 490 nm.

3 Claims, 6 Drawing Sheets

(51) Int. Cl.
*H01L 33/62* (2010.01)
*H01L 25/075* (2006.01)

(52) U.S. Cl.
CPC ............ *H01L 33/50* (2013.01); *H01L 33/507* (2013.01); *H01L 33/62* (2013.01)

(58) Field of Classification Search
USPC .......................................................... 257/89
See application file for complete search history.

(56) References Cited

U.S. PATENT DOCUMENTS

| | | | | |
|---|---|---|---|---|
| 10,008,640 | B2* | 6/2018 | Yeon | ........................ H01L 33/50 |
| 10,084,119 | B2* | 9/2018 | Onuma | ................. H01L 33/504 |
| 2005/0001225 | A1 | 1/2005 | Yoshimura et al. | |
| 2013/0249389 | A1* | 9/2013 | Ishiwata | ................ H01L 33/502 313/512 |
| 2014/0340890 | A1* | 11/2014 | Hata | ...................... A01G 7/045 362/231 |
| 2016/0149094 | A1* | 5/2016 | Onuma | ................ H01L 25/0753 257/89 |
| 2016/0149095 | A1* | 5/2016 | Onuma | ................ C09K 11/646 257/98 |
| 2017/0047488 | A1* | 2/2017 | Kaneko | ................. H01L 33/504 |
| 2018/0076181 | A1* | 3/2018 | Onuma | ................... H01L 33/48 |

FOREIGN PATENT DOCUMENTS

| | | |
|---|---|---|
| JP | 2008-258356 A | 10/2008 |
| JP | 2015-46607 A | 3/2015 |
| WO | WO 2013/150470 A1 | 10/2013 |
| WO | WO 2014/203839 A1 | 12/2014 |
| WO | WO 2016/129495 A1 | 8/2016 |

* cited by examiner

FIG. 4
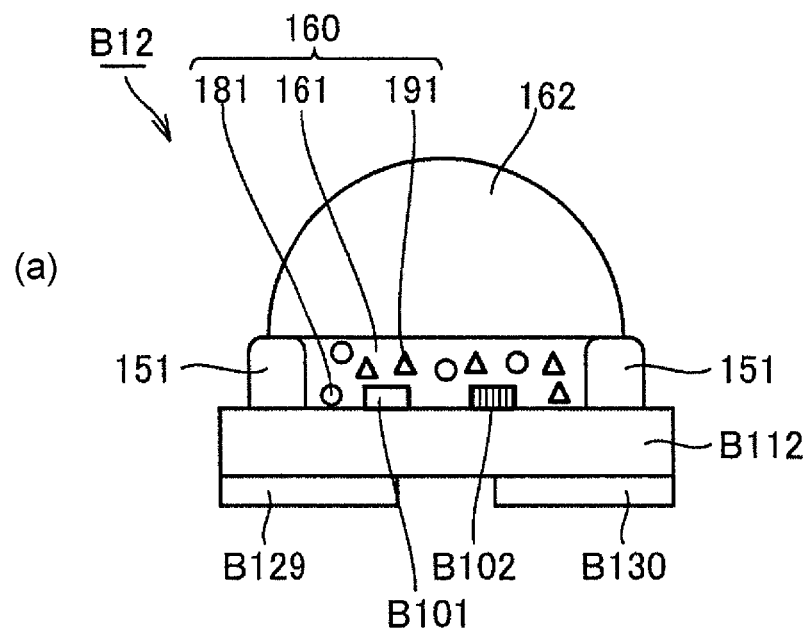
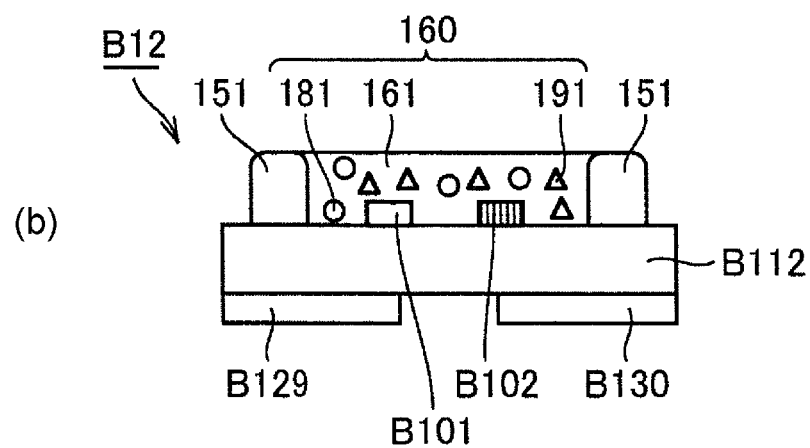

FIG. 5
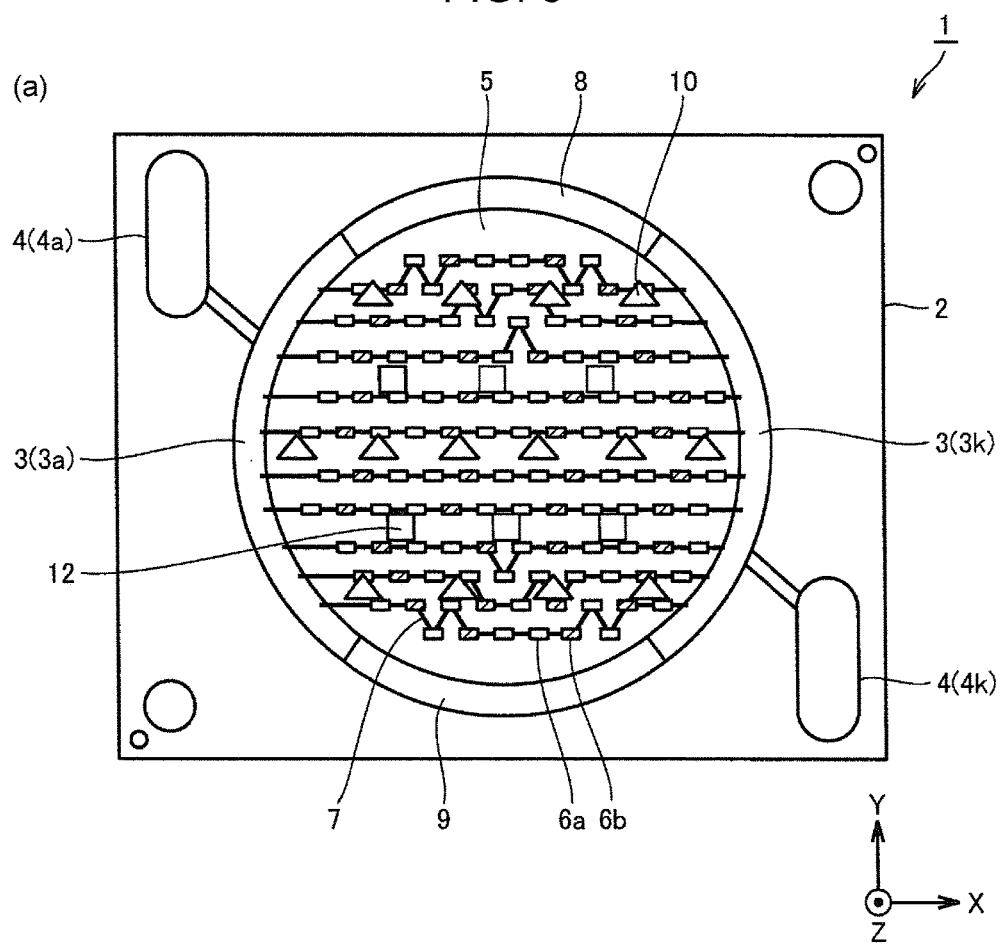
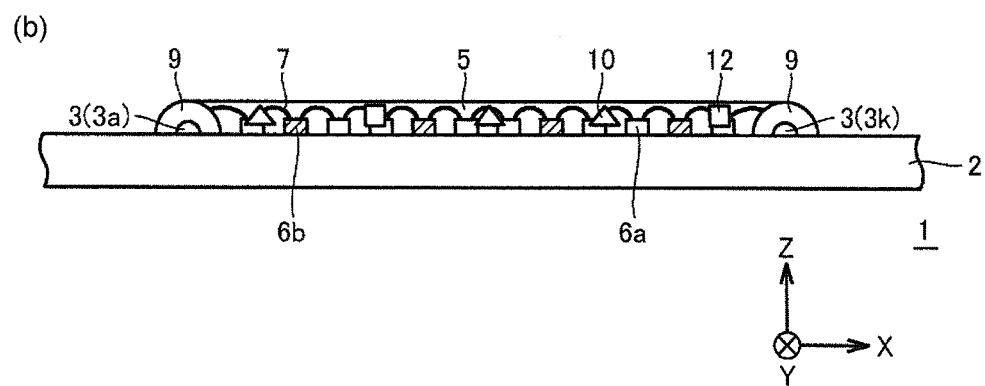

LIGHT EMITTING APPARATUS WITH TWO PRIMARY LIGHTING PEAKS

TECHNICAL FIELD

The present invention relates to a light emitting apparatus.

BACKGROUND ART

A light emitting apparatus in which a semiconductor light emitting element and a phosphor are combined attracts attention as the next-generation light emitting apparatus whose low power consumption, reduced size, high luminance, and wide range color reproducibility are desired, and has been actively researched and developed. Generally, primary light emitted from the semiconductor light emitting element is light which has a range of a near-ultraviolet region to a blue region, and has a wavelength of 380 to 490 nm, for example. Light emitting apparatuses which use various phosphors suitable for the use purpose have also been proposed.

A light emitting apparatus used as, for example, an illumination apparatus has been also variously developed, and various technologies for improving output performance of such a light emitting apparatus are examined. Generally, a phosphor which has high visibility and has the main emission peak in a region for the yellow color which is a complementary color of the blue color is used for improving output performance of a light emitting apparatus. In a light emitting apparatus which can be used for general lighting equipment, it is important to have high color rendering properties ("having high color rendering properties" basically means that an average color rendering index Ra is equal to or greater than 80) and to improve the output performance.

The average color rendering index Ra is generally used as an index indicating the color rendering properties and is an indicator for evaluating whether or not test colors (R1 to R8) are caused to naturally look. In the light emitting apparatus which can be used for general lighting equipment, it is possible to cause the test color to naturally look, that is, it is important to increase the average color rendering index Ra.

As a light emitting apparatus which uses a light emitting diode (LED) light source, there is a light emitting apparatus which uses a blue LED having a peak in a wavelength region of 440 to 460 nm, and a green phosphor and a red phosphor. However, an emission spectrum of the light emitting apparatus has a sharp peak in the wavelength region of 440 to 460 nm, which is a blue region. Thus, a reflection component of the blue color is too strong. In this case, it may not be possible to reproduce a color of an irradiation target that reflects light in the wavelength region of 440 to 460 nm.

In a light emitting apparatus used for, for example, sales of products have a demand to ensure brightness and a demand for reproducibility of the color of an irradiation target. In particular, white, black, navy, and red are colors which are used most frequently in various types of commodities in industries including a clothing industry. Thus, it is important to faithfully reproduce these colors. Accordingly, in a case of such a light emitting apparatus, it is important to improve reproducibility of the white, black, navy, and red colors in addition to the average color rendering index Ra. The average color rendering index Ra is an indicator for evaluating whether the test colors (R1 to R8) are caused to naturally look, and does not indicate reproducibility of the white, red, navy, and black colors which are not included in the test colors. Regarding the red color, a special color rendering index R9 is generally used as an indicator. However, the white, black, and navy colors are not included in the test colors and do not have an evaluation index which is general and has quantitative properties.

PTL 1 (Japanese Patent No. 4072632) discloses a light emitting apparatus as follows, as a light emitting apparatus which vividly develops the red color. The light emitting apparatus includes a light emitting element and a sialon-based phosphor. The light emitting element has a light emission wavelength in a range of 360 nm to 550 nm. The sialon-based phosphor is configured with powder in which α-sialon which has a structure in which a Ca position in Ca-α-sialon represented by a formula of $(Ca_x, Eu_y)(Si, Al)_{12}(O, N)_{16}$ is partially substituted with Eu is 40 mass % to 90 mass %, β-sialon is 5 mass % to 40 mass %, and silicon nitride which is not caused to react is 5 mass % to 30 mass %. A portion of light of the light emitting element has a wavelength converted by the phosphor and then is emitted.

CITATION LIST

Patent Literature

PTL 1: Japanese Patent No. 4072632

SUMMARY OF INVENTION

Technical Problem

In PTL 1, the range of a color temperature of the light emitting apparatus is not limited. In addition, the average color rendering index Ra is not described, and the color rendering properties of the light emitting apparatus are not sufficiently examined.

An object of the present invention is to provide a light emitting apparatus which has a high average color rendering index Ra and has favorable reproducibility of, particularly, the white, red, navy, and black colors among colors of the irradiation target.

Solution to Problem

[1] According to the present invention, there is provided a light emitting apparatus that includes one or more of at least one kind of light emitting elements, and a phosphor that is excited by output light of the light emitting element. In the light emitting apparatus before the phosphor is mounted, when all mounted light emitting elements are caused to emit light, the light emitting apparatus has a peak wavelength of output light in a first wavelength region of 440 nm or longer and shorter than 460 nm, and has a peak wavelength of output light in a second wavelength region of 460 nm to 490 nm.

[2] It is preferable that the light emitting apparatus according to the present invention includes at least one light emitting element or at least two kinds of light emitting elements as constituent elements. The at least one light emitting element emits both of first primary light having a peak emission wavelength in a wavelength range of 440 nm or longer and shorter than 460 nm and second primary light having a peak emission wavelength in a wavelength range of 460 nm to 490 nm. The at least two kinds of light emitting elements are at least one of first light emitting elements that emit first primary light having a peak emission wavelength in the wavelength range of 440 nm or longer and shorter than 460 nm and at least one of second light emitting elements that emit second primary light having a peak emission wavelength in the wavelength range of 460 nm to 490 nm. It is preferable that the light emitting apparatus includes a green phosphor and a red phosphor. The green phosphor is excited by either or both of the first primary light and the second primary light and emits first fluorescent light having a peak emission wavelength in a green region. The red phosphor is excited by either or both of the first primary light and the second primary light and emits second fluorescent light having a peak emission wavelength in a red region. It is preferable that the light emitting apparatus emits light having a correlated color temperature of 2000 K to 6500 K and having an average color rendering index Ra of 80 or greater.

[3] According to the present invention, there is provided a light emitting apparatus which includes a green phosphor that is excited by either or both of the first primary light and the second primary light and emits first fluorescent light having a peak emission wavelength in a green region and a red phosphor that is excited by either or both of the first primary light and the second primary light and emits second fluorescent light having a peak emission wavelength in a red region, and emits light having a correlated color temperature of 2000 K to 6500 K and having an average color rendering index Ra of 80 or greater.

[4] In the light emitting apparatus according to the present invention, preferably, in an emission spectrum of the light emitting apparatus, first light emission intensity E1 is smallest light emission intensity in a wavelength ranges of 450 nm to 500 nm, second light emission intensity E2 is largest light emission intensity in a wavelength range of 430 nm to 460 nm, and a ratio (E2/E1) of the second light emission intensity E2 to the first light emission intensity E1 is equal to or smaller than 3.0.

Advantageous Effects of Invention

As a method of achieving the above-described light emission characteristics, one kind of light emitting element having an emission peak in each of a plurality of wavelength regions may be used or plural kinds of light emitting elements of which each has one emission peak in a single wavelength region may be combined. In addition, the light emitting element having an emission peak in each of a plurality of wavelength regions and the light emitting element having one emission peak in a single wavelength region may be combined.

In a case where plural kinds of light emitting elements of which each has one emission peak in a single wavelength region are combined, the combination of the light emitting elements is adjusted, and thereby it is possible to more accurately control an emission spectrum of the light emitting apparatus and it is easy to obtain an emission spectrum which is approximate to the desired emission spectrum.

In a case where one kind of light emitting element having an emission peak in each of a plurality of wavelength regions is used, there are advantages as follows. Since the light emitting apparatus is configured by one kind of light emitting element, it is possible to more simplify the manufacturing process of the light emitting apparatus. In a light emitting apparatus including a plurality of light emitting elements, a plurality of light emission points is provided in the light emitting apparatus. In a case where a plurality of light emitting elements having different wavelengths is used, a probability that rays of light having different intensity or different colors are emitted from the light emission points is high, and color irregularity on an irradiation surface easily occurs by a difference of the color or the light emission intensity of emitted light at each of the light emission points, a difference of distances between the light emission points (variation of fixed positions of chips on a substrate), or the like. The influence varies depending on an optical system of illumination equipment such as a reflector or a lens. In particular, a probability that the influence is significant in illumination equipment having a narrow irradiation angle is high. In a case of a light emitting apparatus using one kind of light emitting element which has an emission peak in each of a plurality of wavelength regions, all light emission points exhibit the same light emission characteristic. Thus, an optical design of illumination equipment is easily performed and an occurrence of luminance irregularity or color irregularity on an irradiation surface is easily suppressed than in a case of a light emitting apparatus in which light emitting elements having different wavelengths are simultaneously mounted. That is, light is emitted at a uniform light quantity and a uniform light color from light emitting elements in the light emitting apparatus, and thus light having high quality, that is, less frequent occurrence of luminance irregularity or color irregularity on the irradiation surface is obtained. As described above, the light emitting apparatus is configured by one kind of light emitting element having an emission peak in each of the plurality of wavelength regions, and thus it is possible to obtain effects in that the manufacturing process is simplified and excellent optical characteristics are obtained without an occurrence of luminance irregularity or color irregularity because all of the light emitting elements in the light emitting apparatus have the same characteristics.

Although the light emitting element generally exhibits emission of light in a single wavelength region, a light emitting element which is able to exhibit emission of light in a plurality of wavelength regions by a single light emitting element may be also provided. For example, an InGaN-based light emitting diode can exhibit emission of light in a plurality of wavelength regions by a single light emitting element. The InGaN-based light emitting diode includes a plurality of light-emitting layers in the structure thereof. For example, the concentration of In in each of the light-emitting layers is adjusted, and thus it is possible to design a light emission wavelength from each of the light-emitting layers. The plurality of light-emitting layers is stacked to be perpendicular to a light emission surface of the light emitting element. Thus, it is possible to obtain uniform light having no difference in a spectrum, on the light emission surface of the light emitting element. In this manner, it is possible to obtain a light emitting element having an emission peak in each of a plurality of wavelength regions, and it is possible to realize a light emitting apparatus having a simpler manufacturing process or a light emitting apparatus in which luminance irregularity or color irregularity occurs less frequently, by using the above light emitting element.

According to the present invention, it is possible to provide a light emitting apparatus which has a high average color rendering index Ra and has favorable reproducibility of, particularly, the white, red, navy, and black colors among colors of the irradiation target.

BRIEF DESCRIPTION OF DRAWINGS

FIG. 4(a) is a cross-sectional view illustrating a light emitting apparatus B12 according to Embodiment 4 of the present invention, and FIG. 4(b) is a cross-sectional view illustrating a modification example of Embodiment 4.

FIG. 5(a) is a plan view schematically illustrating a light emitting apparatus according to Embodiment 5 of the present invention, and FIG. 5(b) is a cross-sectional view of the light emitting apparatus.

DESCRIPTION OF EMBODIMENTS

Figure 1:
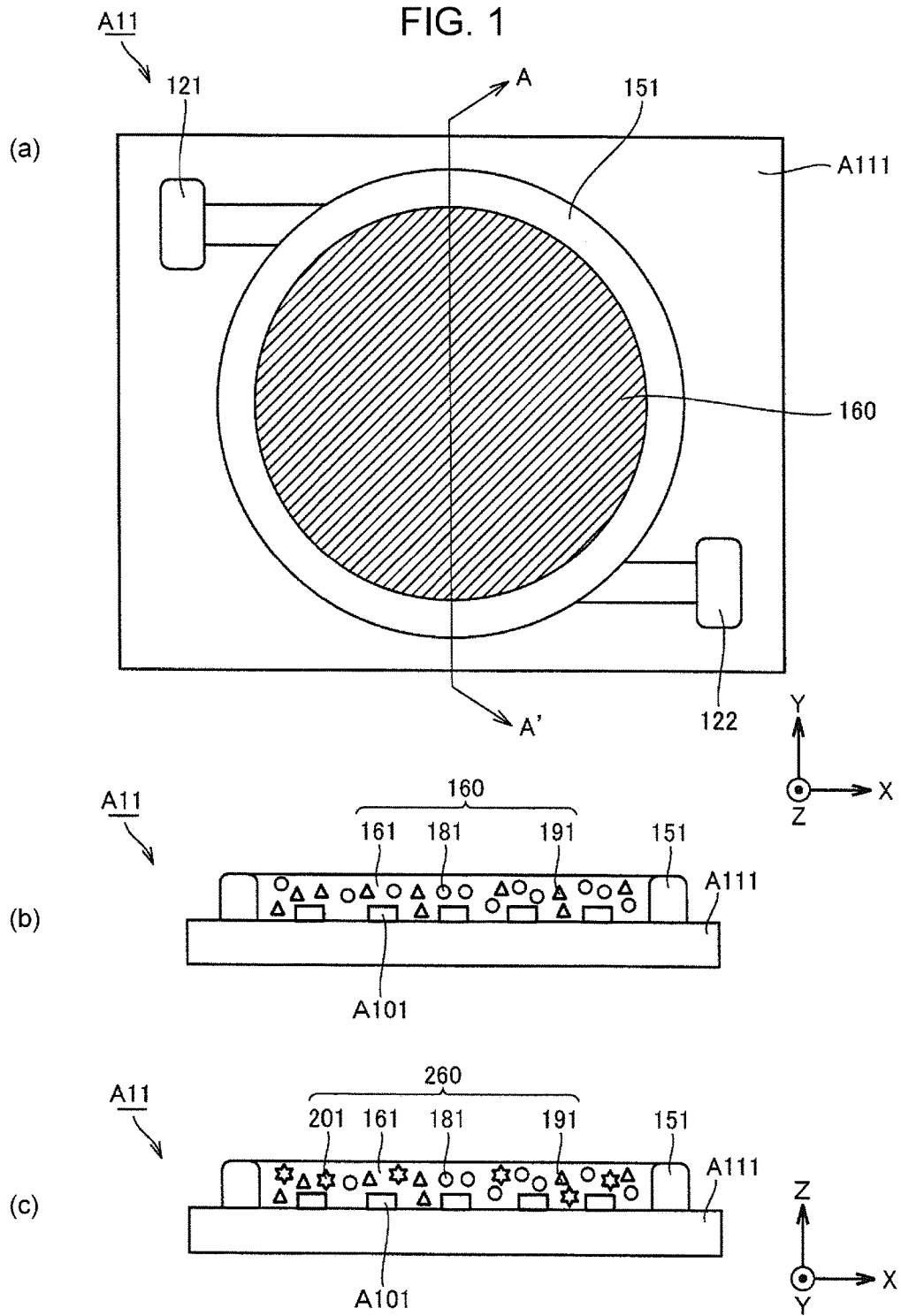
FIG. 1(a) is a plan view schematically illustrating a light emitting apparatus A11 according to Embodiment 1 of the present invention.
FIGS. 1(b) and 1(c) are cross-sectional views illustrating the light emitting apparatus A11.

Hereinafter, light emitting apparatuses according to the present invention will be described with reference to the drawings. In the drawings of the present invention, the same reference sign indicates the same portion or the corresponding portion. Dimension relationships of the length, the width, the thickness, the depth, and the like are appropriately changed for clarifying and simplifying the illustrations and do not indicate practical dimension relationships.

Embodiment 1

(Configuration of Light Emitting Apparatus)

FIG. 1(a) is a plan view illustrating a configuration of a light emitting apparatus A11 according to Embodiment 1 of the present invention. FIGS. 1(b) and 1(c) are cross-sectional views taken along line A-A' illustrated in FIG. 1(a).

The light emitting apparatus A11 in the embodiment includes a substrate A111, a first light emitting element A101, a dam ring (resin frame) 151, and a resin layer including a phosphor (in the following descriptions, simply described as "a first phosphor-containing resin layer") 160. The first light emitting element A101 exhibits emission of light having a plurality of emission peaks which have different peak wavelengths of output light from each other.

The substrate A111 is preferably a substrate formed of ceramics and preferably has a shape of a rectangle in plan view. On one surface of the substrate A111 (in the following descriptions, described as "an upper surface of the substrate A111"), the first light emitting element A101, the dam ring (resin frame) 151, and the first phosphor-containing resin layer 160 are provided, and further, a first electrode land 121 and a second electrode land 122 are provided.

The dam ring 151 is a member configured to define an appearance of the first phosphor-containing resin layer 160 (the first phosphor-containing resin layer 160 includes resin 161, a green phosphor 181, and a red phosphor 191). The dam ring 151 functions as a dam (damming member) for preventing leakage of the resin 161 to an outside of the dam ring 151 when the first phosphor-containing resin layer 160 is formed.

The first electrode land 121 and the second electrode land 122 are provided on the outside of the dam ring 151 in the upper surface of the substrate A111. Preferably, the first electrode land 121 and the second electrode land 122 are provided at corners of the upper surface of the substrate A111. More preferably, the electrode lands are provided on a diagonal line of the substrate A111. Each of the surfaces of the first electrode land 121 and the second electrode land 122 is exposed, and thus the first electrode land 121 and the second electrode land 122 are allowed to be connected to an external terminal. That is, one of the first electrode land 121 and the second electrode land 122 functions as an anode electrode for external connection and the other thereof functions as a cathode electrode for the external connection.

(Light Emitting Element)

(Arrangement Form and Connection Form)

The first light emitting element A101 is preferably an LED and more preferably an LED chip. It is preferable that first light emitting elements A101 are electrically connected to each other through a wire (not illustrated). The wire is preferably connected to the first electrode land 121 and the second electrode land 122. Thus, external power applied from the external terminal to the first electrode land 121 or the second electrode land 122 is supplied to the first light emitting elements A101 through the wire. Accordingly, the first light emitting element A101 emits light.

The arrangement form of the first light emitting elements A101 is not particularly limited. However, it is preferable that the first light emitting elements A101 are arranged at an equal interval in a region surrounded by the dam ring 151 on the upper surface of the substrate A111. Thus, it is possible to reduce the occurrence of luminance irregularity of an irradiation surface, which occurs by light emitted from the light emitting apparatus A11. Accordingly, it is possible to maintain high optical characteristics of the light emitting apparatus A11.

As described above, the arrangement form of the first light emitting elements A101 is not particularly limited. However, it is necessary that the first light emitting elements A101 are arranged so as to show a peak in a wavelength range of 440 nm or longer and shorter than 460 nm and a peak in a wavelength range of 460 nm to 490 nm, in the emission spectrum of the light emitting apparatus A11.

The connection form of the first light emitting elements A101 is not particularly limited. However, in a case where an element row is configured by connecting the first light emitting elements A101 in series and a plurality of element rows is formed, it is preferable that the first light emitting elements A101 are electrically connected so as to cause the number of series connections of the first light emitting elements A101 in each row to be the same. Thus, an equivalent current (current value is the same) can flow in all light emitting elements included in the light emitting apparatus A11. Accordingly, it is possible to maintain high optical characteristics of the light emitting apparatus A11.

(Optical Characteristics of Light Emitting Element)

The first light emitting elements A101 have peak wavelengths of output light in two wavelength regions, namely, have a peak of the output light in a wavelength region of 440 nm or longer and shorter than 460 nm and have a peak of the output light in a wavelength region of 460 nm to 490 nm (for example, the peak wavelengths of the output light are 450 nm and 470 nm). That is, each of the first light emitting elements A101 is a light emitting element and preferably a light emitting diode. Thus, at least a portion of the output light of the first light emitting elements A101 constitutes a portion (for example, blue component) of light (for example, white light) from the light emitting apparatus A11.

A portion of the output light of the first light emitting elements A101 excites green phosphors 181 so as to generate green light (peak wavelength is longer than 490 nm and 580 nm or shorter). A portion of the remainder of the output light of the first light emitting elements A101 excites red phosphors 191 so as to generate red light (peak wavelength is longer than 580 nm and 780 nm or shorter). That is, the portion of the output light of the first light emitting elements A101 constitutes a green component of light (for example, white light) from the light emitting apparatus A11 by the green phosphors 181. The portion of the remainder of the output light of the first light emitting elements A101 constitutes a red component of the light (for example, white light) from the light emitting apparatus A11 by the red phosphors 191.

(First Phosphor-Containing Resin Layer)

The first phosphor-containing resin layer 160 includes the resin 161, the green phosphor 181, and the red phosphor 191. The first phosphor-containing resin layer 160 is preferably formed in a manner that a region surrounded by the dam ring 151 on the upper surface of the substrate A111 is filled with the resin 161, the green phosphor 181, and the red phosphor 191, and then the resin 161 is cured. The first phosphor-containing resin layer 160 is preferably provided so as to bury the first light emitting elements A101 which are arranged in the region surrounded by the dam ring 151 on the upper surface of the substrate A111. That is, in the embodiment, the first light emitting elements A101 are sealed all together by the first phosphor-containing resin layer 160. In this specification, "being sealed all together" means being sealed by the same resin.

The resin 161 included in the first phosphor-containing resin layer 160 is preferably resin having excellent light-transmitting properties. More preferably, the resin 161 is resin which is able to transmit the output light of the first light emitting elements A101, green light emitted by the green phosphor 181, and red light emitted by the red phosphor 191. The resin 161 is not particularly limited as long as the resin 161 is resin able to be used as a sealing resin which is included in a resin-sealed type light emitting apparatus. For example, it is preferable that the resin 161 is dimethyl-based silicon resin, phenyl-based silicon resin, epoxy resin, or the like.

The green phosphor 181 is preferably bivalent europium activated β type SiAlON. The red phosphor 191 is preferably $Sr_xCa_{1-x}AlSiN_3:Eu^{2+}$. The green phosphor 181 and the red phosphor 191 are not limited thereto and may be phosphors which will be described below. It is preferable that a combination of a light emitting element and a phosphor is selected so as to obtain the optimum condition considering the excitation characteristics of the phosphor.

The first phosphor-containing resin layer 160 may include only one of the green phosphor 181 and the red phosphor 191. Two kinds or more of green phosphors 181 may be used as the green phosphor 181 and two kinds or more of red phosphors 191 may be used as the red phosphor 191. However, if the first phosphor-containing resin layer 160 includes one kind or more of green phosphors 181 and one kind or more of red phosphors 191, the light emitting apparatus A11 can function as a white light emitting apparatus.

(Green Phosphor)

The green phosphor 181 is a phosphor which is excited by the output light of the first light emitting element A101 so as to emit light of a green color. For example, the green phosphor 181 is preferably the following (1) to (7). Any one of the following (1) to (7) may be used as the green phosphor 181 or a combination of two or more of the following (1) to (7) may be used.

(1) β type SiAlON represented by a general formula $Eu_{a1}Si_{b1}Al_{c1}O_{d1}N_{e1}$ (0.001≤a1≤0.2) (bivalent europium activated oxynitride phosphor)

(2) Phosphor which is represented by $(MI)_{3-x2}Ce_{x2}(MII)_5O_{12}$ (MI indicates at least one of Lu, Y, La, and Gd. MII indicates at least one of Al and Ga. 0.005≤x2≤0.3) and has a garnet type crystal structure (trivalent cerium activated oxide phosphor)

(3) Phosphor represented by $(MIII)_{2-x3}Eu_{x3}SiO_4$ (MIII indicates at least one of Mg, Ca, Sr, and Ba. 0.005≤x3≤0.4) (bivalent europium activated silicate phosphor)

(4) Phosphor represented by $(MIII)_{3-x4}Ce_{x4}(MIV)_2Si_3O_{12}$ (MIII indicates at least one of Mg, Ca, Sr, and Ba. MIV indicates at least one of Li, Na, K, Cs, Rb, Mg, Ca, Ba, Al, Ga, In, Sc, Y, La, Gd, and Lu. 0.005≤x4≤0.3) (trivalent cerium activated silicate phosphor)

(5) Phosphor represented by $(MI)_{3-x5}Ce_{x5}Si_6N_{11}$ (MI indicates at least one of Lu, Y, La, and Gd. 0.005≤x≤0.2) (trivalent cerium activated nitride phosphor)

(6) Phosphor represented by $(MV)_{1-a6}Eu_{a6}Mg_{1-x6}Al_{10-y6}Mn_{x6+y6}O_{17}$ (MV indicates at least one of Sr and Ba. 0.005≤a6≤0.2, 0.005≤x6+y6≤0.2) (bivalent europium and bivalent manganese activated aluminate phosphor)

(7) Phosphor represented by $(MV)_{3-a7}Eu_{a7}Si_6O_{12}N_2$ (MV indicates at least one of Sr and Ba. 0.005≤a7≤0.2) (europium and bivalent manganese activated silicate phosphor)

(Red Phosphor)

The red phosphor 191 is a phosphor which is excited by the output light of the first light emitting element A101 so as to emit light of a red color. For example, the red phosphor 191 is preferably the following (11) to (15). Any one of the following (11) to (15) may be used as the red phosphor 191 or a combination of two or more of the following (11) to (15) may be used.

(11) Phosphor represented by $(MIII)_{1-x11}Eu_{x11}$ (MVI)$SiN_3$ (MIII indicates at least one of Mg, Ca, Sr, and Ba. MVI indicates at least one of Al, Ga, In, Sc, Y, La, Gd, and Lu. 0.005≤x11≤0.2) (bivalent europium activated nitride phosphor)

(12) Phosphor represented by $(MIII)_{2-x12}Eu_{x12}Si_5N_8$ (MIII indicates at least one of Mg, Ca, Sr, and Ba. 0.005≤x12≤0.2) (bivalent europium activated nitride phosphor)

(13) α type SiAlON represented by $Eu_f(MVII)_gSi_hAl_iO_jN_k$ (MVII indicates at least one of Li, Na, K, Rb, Cs, Mg, Ca, Sr, Ba, Sc, Y, La, and Gd. 0.001≤f≤0.2) (bivalent europium activated oxynitride phosphor)

(14) Phosphor represented by $(MVIII)_2((MIX)_{1-x14}Mn_{x14})F_6$ (MVIII indicates at least one of Li, Na, K, Rb, and Cs. MIX indicates at least one of Ge, Si, Sn, Ti, and Zr. 0.005≤x14≤0.3) (tetravalent manganese activated fluoride metal salt phosphor)

(15) Phosphor represented by $(MX)_{2-x15}Eu_{x15}O_{3-y15}S_{y15}$ (MX indicates at least one of Y, La, and Gd. 0.005≤x15≤0.4, 0.0≤y15≤2.0) (trivalent europium activated sulfate phosphor)

[Different Form of Light Emitting Apparatus]

The light emitting apparatus A11 may further include configurations as follows.

A second light emitting element A102 may be used in addition to the first light emitting element A101. The second light emitting element A102 has an emission peak in a wavelength region of 380 nm or longer and shorter than 440 nm. Since the second light emitting element A102 has an emission peak in the wavelength region of 380 nm or longer and shorter than 440 nm, a variety of combination of the light emitting elements is increased and the choice for the phosphor becomes wider. More specifically, it is possible to maintain high emission efficiency of a phosphor by output light of the second light emitting element A102, even in a case where resin including the phosphor which has difficulty in excitation by the output light of the first light emitting element A101 is used. Thus, it is possible to further improve emission efficiency of the light emitting apparatus A11. Thus, it is possible to realize various emission spectra. Accordingly, it is possible to increase the degree of freedom for the design of the emission spectrum, and thus it is easier to obtain a desired emission spectrum in the light emitting apparatus A11.

(Blue Phosphor)

A second phosphor-containing resin layer 260 may be used instead of the first phosphor-containing resin layer 160 (FIG. 1(c)). The second phosphor-containing resin layer 260 further includes a blue phosphor 201 in addition to the resin 161, the green phosphor 181, and the red phosphor 191. In order to improve the color rendering properties of the light emitting apparatus A11, it is advantageous that the spectrum of light emitted by the light emitting apparatus A11 has a broad band. Here, the spectrum of output light of the light emitting element has a band broader than that of the emission spectrum of the phosphor. Thus, it is easy to improve the color rendering properties of the light emitting apparatus A11 by using the blue phosphor 201. FIG. 1(c) is a cross-sectional view illustrating a modification example of the light emitting apparatus in the embodiment. It can be said that the second phosphor-containing resin layer 260 may also be used instead of the first phosphor-containing resin layer 160 in Embodiments 2 to 5 which will be described later.

The blue phosphor 201 is a phosphor excited by either or both of rays of output light from the first light emitting element A101 and the second light emitting element A102, so as to emit light having a blue color. The blue phosphor 201 may be bivalent europium activated halophosphorus oxide which is represented by the following (21). The blue phosphor 201 may be bivalent europium activated aluminum oxide which is represented by the following (22). The blue phosphor 201 may be trivalent cerium activated nitride which is represented by the following (23). Any one of the following (21) to (23) or a combination of two or more of the following (21) to (23) may be used as the blue phosphor 201.

(21) Phosphor represented by $(MXI)_{5-x21}Eu_{x21}(PO_4)_3(MXII)$ (MXI indicates at least one of Ca, Sr, and Ba. MXII indicates at least one of F, Cl, and Br. $0.1 \leq x21 \leq 1.5$) (bivalent europium activated phosphorus oxide phosphor)

(22) Phosphor represented by $(MXIII)_{1-a22}Eu_{a22}MgAl_{10}O_{17}$ (MXIII indicates at least one of Sr and Ba. $0.005 \leq a22 \leq 0.2$) (bivalent europium activated aluminum oxide phosphor)

(23) Phosphor represented by $(MI)_{1-x23}Ce_{x23}Si_3N_5$ (MI indicates at least one of Lu, Y, La, and Gd. $0.005 \leq x23 \leq 0.2$) (trivalent cerium activated nitride phosphor)

[Application to Light Emitting Apparatus Such as Illumination Apparatus or Backlight Apparatus]

Since the light emitting apparatus A11 has the above-mentioned optical characteristics, the light emitting apparatus A11 can be used as a light source of a light emitting apparatus (examples of the light emitting apparatus include an illumination apparatus and a backlight apparatus). That is, the light emitting apparatus in the embodiment includes the light emitting apparatus A11. Thus, it is possible to provide the light emitting apparatus such as an illumination apparatus or a backlight apparatus, which has the above-mentioned optical characteristics. In the illumination apparatus or the backlight apparatus in the embodiment, configurations other than a light emitting apparatus can be used without being limited to a configuration of a known illumination apparatus or a known backlight apparatus in the related art.

Embodiment 2

Figure 2:
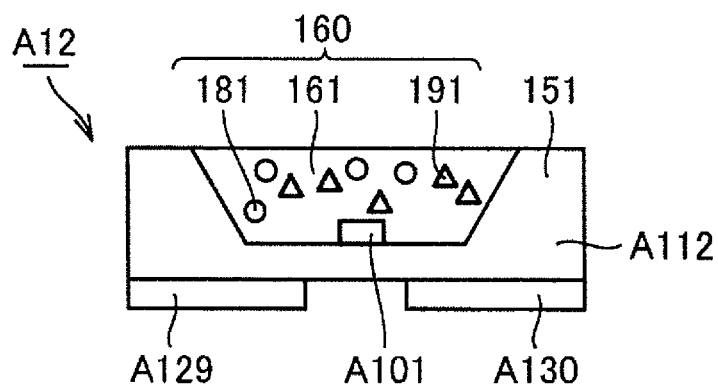
FIG. 2 is a cross-sectional view illustrating a light emitting apparatus A12 according to Embodiment 2 of the present invention.

In Embodiment 2 of the present invention, as illustrated in FIG. 2, a light emitting apparatus A12 is a surface-mounting (SMD) light emitting apparatus of a lead frame type which includes the first light emitting element A101.

In Embodiment 2 of the present invention, the light emitting apparatus A12 includes at least one or more first light emitting elements A101 which have emission peaks in two kinds of wavelength regions.

As illustrated in FIG. 2, a light source A12 in the embodiment has one first light emitting element A101 mounted on a frame A112. The first phosphor-containing resin layer 160 is provided around the first light emitting element A101 so as to cover the light emitting element A101. In the first phosphor-containing resin layer 160, the green phosphors 181 and the red phosphors 191 are dispersed or precipitated in the resin 161.

The frame A112 is formed of a base material of white resin, for example. Thus, it is possible to provide the frame A112 having high visible-light reflection characteristics, that is, high light extraction efficiency.

Electrodes A129 and A130 are provided on the frame A112. Thus, the first light emitting element A101 mounted on the frame A112 is connected to the electrodes A129 and A130 via through electrodes (not illustrated) for the supply of power. However, it is not necessarily limited to the through electrode. For example, the electrodes A129 and A130 may be formed on a side surface or side surfaces of the frame A112.

As described above, in the light emitting apparatus A12 in the embodiment, the first phosphor-containing resin layer 160 in which the green phosphors 181 and the red phosphors 191 are dispersed or precipitated is provided so as to cover the first light emitting element A101. In the first phosphor-containing resin layer 160, the resin 161 in which the green phosphors 181 and the red phosphors 191 are dispersed or precipitated is formed of transparent silicone resin.

The first light emitting element A101 and the first phosphor-containing resin layer 160 are provided on one surface of the frame A112 (in the following descriptions, described as "an upper surface of the frame A112"). The first phosphor-containing resin layer 160 seals the first light emitting element A101 and is provided in a region surrounded by a frame wall surface on the upper surface of the frame A112.

An inner circumferential surface of the wall surface of the frame A112 may be perpendicular to the upper surface of the frame A112. However, the inner circumferential surface of the frame wall surface is preferably inclined with respect to the upper surface of the frame A112, such that the diameter of an opening is increased from the upper surface of the frame A112 toward the upper surface of the first phosphor-containing resin layer 160. Thus, it is possible to extract light with high efficiency.

The frame wall surface may not be provided. For example, if resin having high thixotropy is used as the resin 161, it is possible to prevent flowing of the resin 161 toward the peripheral edge of the upper surface of the frame A112 even though the frame wall surface is not provided. A surface-mounting type light source unit may be configured by using a substrate (for example, a flat substrate which is formed of ceramics and is not illustrated in FIG. 2) which has a shape of a rectangle in plan view, as the frame A112.

[Different Form of Light Emitting Apparatus]

The light emitting apparatus A12 may further include configurations as follows.

A second light emitting element A102 may be used in addition to the first light emitting element A101. The second light emitting element A102 has an emission peak in a wavelength region of 380 nm or longer and shorter than 440 nm. Since the second light emitting element A102 has an emission peak in the wavelength region of 380 nm or longer and shorter than 440 nm, a variety of combination of the light emitting elements is increased and the choice for the phosphor becomes wider. More specifically, it is possible to maintain high emission efficiency of a phosphor by output light of the second light emitting element A102, even in a case where resin including the phosphor which has difficulty in excitation by the output light of the first light emitting element A101 is used. Thus, it is possible to further improve emission efficiency of the light emitting apparatus A12. Thus, it is possible to realize various emission spectra. Accordingly, it is possible to increase the degree of freedom for the design of the emission spectrum, and thus it is easier to obtain a desired emission spectrum in the light emitting apparatus A12.

(Blue Phosphor)

A second phosphor-containing resin layer 260 may be used instead of the first phosphor-containing resin layer 160 (see FIG. 1(c)). The second phosphor-containing resin layer 260 further includes a blue phosphor 201 in addition to the resin 161, the green phosphor 181, and the red phosphor 191. In order to improve the color rendering properties of the light emitting apparatus A12, it is advantageous that the spectrum of light emitted by the light emitting apparatus A12 has a broad band. Here, the spectrum of output light of the light emitting element has a band broader than that of the emission spectrum of the phosphor. Thus, it is easy to improve the color rendering properties of the light emitting apparatus A12 by using the blue phosphor 201.

The blue phosphor 201 is a phosphor excited by either or both of rays of output light from the first light emitting element A101 and the second light emitting element A102, so as to emit light having a blue color. The blue phosphor 201 may be bivalent europium activated halophosphorus oxide which is represented by the following (21). The blue phosphor 201 may be bivalent europium activated aluminum oxide which is represented by the following (22). The blue phosphor 201 may be trivalent cerium activated nitride which is represented by the following (23). Any one of the following (21) to (23) or a combination of two or more of the following (21) to (23) may be used as the blue phosphor 201.

(21) Phosphor represented by $(MXI)_{5-x21}Eu_{x21}(PO_4)_3$ (MXII) (MXI indicates at least one of Ca, Sr, and Ba. MXII indicates at least one of F, Cl, and Br. $0.1 \leq x21 \leq 1.5$) (bivalent europium activated phosphorus oxide phosphor)

(22) Phosphor represented by $(MXIII)_{1-a22}Eu_{a22}MgAl_{10}O_{17}$ (MXIII indicates at least one of Sr and Ba. $0.005 \leq a22 \leq 0.2$) (bivalent europium activated aluminum oxide phosphor)

(23) Phosphor represented by $(MI)_{1-x23}Ce_{x23}Si_3N_5$ (MI indicates at least one of Lu, Y, La, and Gd. $0.005 \leq x23 \leq 0.2$) (trivalent cerium activated nitride phosphor)

[Application to Light Emitting Apparatus Such as Illumination Apparatus or Backlight Apparatus]

Since the light emitting apparatus A12 has the above-mentioned optical characteristics, it is possible to use the light emitting apparatus A12 as a light source of a light emitting apparatus. That is, the light emitting apparatus in the embodiment includes the light emitting apparatus A12. Thus, it is possible to provide the light emitting apparatus such as an illumination apparatus or a backlight apparatus, which has the above-mentioned optical characteristics. In the illumination apparatus or the backlight apparatus in the embodiment, configurations other than a light emitting apparatus can be used without being limited to a configuration of a known illumination apparatus or a known backlight apparatus in the related art.

Embodiment 3

Figure 3:
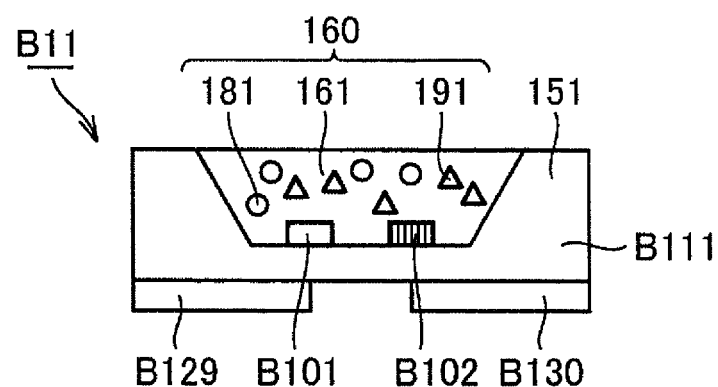
FIG. 3 is a cross-sectional view illustrating a light emitting apparatus B11 according to Embodiment 3 of the present invention.

In Embodiment 3 of the present invention, as illustrated in FIG. 3, a light emitting apparatus B11 is an SMD type light emitting apparatus of a lead frame type which includes a first light emitting element B101 and a second light emitting element B102.

In Embodiment 3 of the present invention, the light emitting apparatus B11 includes at least one or more of first light emitting elements B101 and at least one or more of second light emitting elements B102 which respectively have emission peaks in two kinds of wavelength regions. In the following descriptions, a case where one first light emitting element B101 and one second light emitting element B102 are mounted will be described as an example.

As illustrated in FIG. 3, the light emitting apparatus B11 in the embodiment has one first light emitting element B101 and one second light emitting element B102 which are mounted on a frame B111. The first phosphor-containing resin layer 160 is provided around the first light emitting element B101 and the second light emitting element B102 so as to cover the light emitting elements B101 and B102. In the first phosphor-containing resin layer 160, the green phosphors 181 and the red phosphors 191 are dispersed or precipitated in the resin 161.

The frame B111 is formed of a base material of white resin, for example. Thus, it is possible to provide the frame B111 having high visible-light reflection characteristics, that is, high light extraction efficiency.

Electrodes B129 and B130 are provided on the frame B111. Thus, the first light emitting element B101 and the second light emitting element B102 which have been mounted on the frame B111 are connected to the electrodes B129 and B130 via through electrodes (not illustrated) for the supply of power. However, it is not necessarily limited to the through electrode. For example, the electrodes B129 and B130 may be formed on a side surface or side surfaces of the frame B111.

As described above, in the light emitting apparatus B11 in the embodiment, the first phosphor-containing resin layer 160 in which the green phosphors 181 and the red phosphors 191 are dispersed or precipitated is provided so as to cover the first light emitting element B101 and the second light emitting element B102. In the first phosphor-containing resin layer 160, the resin 161 in which the green phosphors 181 and the red phosphors 191 are dispersed or precipitated is formed of transparent silicone resin.

The first light emitting element B101, the second light emitting element B102, and the first phosphor-containing resin layer 160 are provided on one surface of the frame B111 (in the following descriptions, described as "an upper surface of the frame B111"). The first phosphor-containing resin layer 160 seals the first light emitting element B101 and is provided in a region surrounded by a frame wall surface on the upper surface of the frame B111.

An inner circumferential surface of the wall surface of the frame B111 may be perpendicular to the upper surface of the frame B111. However, the inner circumferential surface of the frame wall surface is preferably inclined with respect to the upper surface of the frame B111, such that the diameter of an opening is increased from the upper surface of the frame B111 toward the upper surface of the first phosphor-containing resin layer 160. Thus, it is possible to extract light with high efficiency.

The frame wall surface may not be provided. For example, if resin having high thixotropy is used as the resin 161, it is possible to prevent flowing of the resin 161 toward the peripheral edge of the upper surface of the frame B111 even though the frame wall surface is not provided. A surface-mounting type light source unit may be configured by using a substrate (for example, a flat substrate which is formed of ceramics and is not illustrated in FIG. 3) which has a shape of a rectangle in plan view, as the frame B111.

[Different Form of Light Emitting Apparatus]

The light emitting apparatus B11 may further include configurations as follows.

A third light emitting element B103 may be used in addition to the first light emitting element B101 and the second light emitting element B102. The third light emitting element B103 has an emission peak in a wavelength region of 380 nm or longer and shorter than 440 nm. Since the third light emitting element B103 has an emission peak in the wavelength region of 380 nm or longer and shorter than 440 nm, a variety of combination of the light emitting elements is increased and the choice for the phosphor becomes wider. More specifically, it is possible to maintain high emission efficiency of a phosphor by output light of the third light emitting element B103, even in a case where resin including the phosphor which has difficulty in excitation by output light of the first light emitting element B101 or the second light emitting element B102 is used. Thus, it is possible to further improve emission efficiency of the light emitting apparatus B11. Thus, it is possible to realize various emission spectra. Accordingly, it is possible to increase the degree of freedom for the design of the emission spectrum, and thus it is easier to obtain a desired emission spectrum in the light emitting apparatus B11.

(Blue Phosphor)

A second phosphor-containing resin layer 260 may be used instead of the first phosphor-containing resin layer 160. The second phosphor-containing resin layer 260 further includes a blue phosphor 201 in addition to the resin 161, the green phosphor 181, and the red phosphor 191. In order to improve the color rendering properties of the light emitting apparatus B11, it is advantageous that the spectrum of light emitted by the light emitting apparatus B11 has a broad band. Here, the spectrum of output light of the light emitting element has a band broader than that of the emission spectrum of the phosphor. Thus, it is easy to improve the color rendering properties of the light emitting apparatus B11 by using the blue phosphor 201.

The blue phosphor 201 is a phosphor excited by any or all of rays of output light from the first light emitting element B101, the second light emitting element B102, and the third light emitting element B103, so as to emit light having a blue color. The blue phosphor 201 may be bivalent europium activated halophosphorus oxide which is represented by the following (21). The blue phosphor 201 may be bivalent europium activated aluminum oxide which is represented by the following (22). The blue phosphor 201 may be trivalent cerium activated nitride which is represented by the following (23). Any one of the following (21) to (23) or a combination of two or more of the following (21) to (23) may be used as the blue phosphor 201.

(21) Phosphor represented by $(MXI)_{5-x21}Eu_{x21}(PO_4)_3(MXII)$ (MXI indicates at least one of Ca, Sr, and Ba. MXII indicates at least one of F, Cl, and Br. $0.1 \leq x21 \leq 1.5$) (bivalent europium activated phosphorus oxide phosphor)

(22) Phosphor represented by $(MXIII)_{1-a22}Eu_{a22}MgAl_{10}O_{17}$ (MXIII indicates at least one of Sr and Ba. $0.005 \leq a22 \leq 0.2$) (bivalent europium activated aluminum oxide phosphor)

(23) Phosphor represented by $(MI)_{1-x23}Ce_{x23}Si_3N_5$ (MI indicates at least one of Lu, Y, La, and Gd. $0.005 \leq x23 \leq 0.2$) (trivalent cerium activated nitride phosphor)

[Application to Light Emitting Apparatus Such as Illumination Apparatus or Backlight Apparatus]

Since the light emitting apparatus B11 has the above-mentioned optical characteristics, it is possible to use the light emitting apparatus B11 as a light source of a light emitting apparatus. That is, the light emitting apparatus in the embodiment includes the light emitting apparatus B11. Thus, it is possible to provide the light emitting apparatus such as an illumination apparatus or a backlight apparatus, which has the above-mentioned optical characteristics. In the illumination apparatus or the backlight apparatus in the embodiment, configurations other than a light emitting apparatus can be used without being limited to a configuration of a known illumination apparatus or a known backlight apparatus in the related art.

Embodiment 4

In Embodiment 4 of the present invention, as illustrated in FIG. 4, a light emitting apparatus B12 is an SMD type light emitting apparatus of a double sealing type which includes a first light emitting element B101 and a second light emitting element B102.

In Embodiment 4 of the present invention, the light emitting apparatus B12 includes at least one or more of first light emitting elements B101 and at least one or more of second light emitting elements B102 which respectively have emission peaks in different wavelength regions. In the following descriptions, a case where one first light emitting element B101 and one second light emitting element B102 are mounted will be described as an example.

As illustrated in FIG. 4(a), the light emitting apparatus B12 in the embodiment has one first light emitting element B101 and one second light emitting element B102 which are mounted on a substrate B112. The first phosphor-containing resin layer 160 is provided around the first light emitting element B101 and the second light emitting element B102 so as to cover the light emitting elements B101 and B102. In the first phosphor-containing resin layer 160, the green phosphors 181 and the red phosphors 191 are dispersed or precipitated in the resin 161. Further, transparent silicone resin 162 is provided so as to cover the first phosphor-containing resin layer 160. Accordingly, the light emitting apparatus B12 in the embodiment has a package in which the first light emitting element B101 and the second light emitting element B102 are doubly sealed on the substrate B112 by the first phosphor-containing resin layer 160 and the silicone resin 162.

The substrate B112 is formed of a ceramic base material, for example. Thus, it is possible to provide the substrate B112 having high heat-dissipation performance.

Electrodes B129 and B130 are provided on the back surface of the substrate B112. Thus, the first light emitting element B101 and the second light emitting element B102 which have been mounted on the substrate B112 are connected to the electrodes B129 and B130 via through electrodes (not illustrated) for the supply of power. However, it is not necessarily limited to the through electrode. For example, the electrodes B129 and B130 may be formed on a side surface or side surfaces of the substrate B112.

As described above, in the light emitting apparatus B12 in the embodiment, the first phosphor-containing resin layer 160 in which the green phosphors 181 and the red phosphors 191 are dispersed or precipitated is provided so as to cover the first light emitting element B101 and the second light emitting element B102. In the first phosphor-containing resin layer 160, the resin 161 in which the green phosphors 181 and the red phosphors 191 are dispersed or precipitated is formed of transparent silicone resin.

The first light emitting element B101, the second light emitting element B102, the dam ring 151, and the first phosphor-containing resin layer 160 are provided on one surface of the substrate B112 (in the following descriptions, described as "an upper surface of the substrate B112"). The first phosphor-containing resin layer 160 seals the first light emitting element B101 and is provided in a region surrounded by the dam ring 151 on the upper surface of the substrate B112.

An inner circumferential surface of the dam ring 151 may be perpendicular to the upper surface of the substrate B112. However, the inner circumferential surface of the dam ring 151 is preferably inclined with respect to the upper surface of the substrate B112, such that the diameter of an opening of the dam ring 151 is increased from the upper surface of the substrate B112 toward the upper surface of the first phosphor-containing resin layer 160. Thus, it is possible to extract light with high efficiency.

The dam ring 151 may not be provided. For example, if resin having high thixotropy is used as the resin 161, it is possible to prevent flowing of the resin 161 toward the peripheral edge of the upper surface of the substrate B112 even though the dam ring 151 is not provided. A surface-mounting type light source unit may be configured not by using the substrate (FIG. 4(a)) having a shape of a rectangle in plan view, but by using a substrate (for example, lead frame substrate) having a bathtub shape, as the substrate B112.

[Different Form of Light Emitting Apparatus]

The light emitting apparatus B12 may further include configurations as follows.

A third light emitting element B103 may be used in addition to the first light emitting element B101 and the second light emitting element B102. The third light emitting element B103 has an emission peak in a wavelength region of 380 nm or longer and shorter than 440 nm. Since the third light emitting element B103 has an emission peak in the wavelength region of 380 nm or longer and shorter than 440 nm, a variety of combination of the light emitting elements is increased and the choice for the phosphor becomes wider. More specifically, it is possible to maintain high emission efficiency of a phosphor by output light of the third light emitting element B103, even in a case where resin including the phosphor which has difficulty in excitation by output light of the first light emitting element B101 or the second light emitting element B102 is used. Thus, it is possible to further improve emission efficiency of the light emitting apparatus B12. Thus, it is possible to realize various emission spectra. Accordingly, it is possible to increase the degree of freedom for the design of the emission spectrum, and thus it is easier to obtain a desired emission spectrum in the light emitting apparatus B12.

(Blue Phosphor)

A second phosphor-containing resin layer 260 may be used instead of the first phosphor-containing resin layer 160. The second phosphor-containing resin layer 260 further includes a blue phosphor 201 in addition to the resin 161, the green phosphor 181, and the red phosphor 191. In order to improve the color rendering properties of the light emitting apparatus B12, it is advantageous that the spectrum of light emitted by the light emitting apparatus B12 has a broad band. Here, the spectrum of output light of the light emitting element has a band broader than that of the emission spectrum of the phosphor. Thus, it is easy to improve the color rendering properties of the light emitting apparatus B12 by using the blue phosphor 201.

The blue phosphor 201 is a phosphor excited by any or all of rays of output light from the first light emitting element B101, the second light emitting element B102, and the third light emitting element B103, so as to emit light having a blue color. The blue phosphor 201 may be bivalent europium activated halophosphorus oxide which is represented by the following (21). The blue phosphor 201 may be bivalent europium activated aluminum oxide which is represented by the following (22). The blue phosphor 201 may be trivalent cerium activated nitride which is represented by the following (23). Any one of the following (21) to (23) or a combination of two or more of the following (21) to (23) may be used as the blue phosphor 201.

(21) Phosphor represented by $(MXI)_{5-x21}Eu_{x21}(PO_4)_3(MXII)$ (MXI indicates at least one of Ca, Sr, and Ba. MXII indicates at least one of F, Cl, and Br. $0.1 \leq x21 \leq 1.5$) (bivalent europium activated phosphorus oxide phosphor)

(22) Phosphor represented by $(MXIII)_{1-a22}Eu_{a22}MgAl_{10}O_{17}$ (MXIII indicates at least one of Sr and Ba. $0.005 \leq a22 \leq 0.2$) (bivalent europium activated aluminum oxide phosphor)

(23) Phosphor represented by $(MI)_{1-x23}Ce_{x23}Si_3N_5$ (MI indicates at least one of Lu, Y, La, and Gd. $0.005 \leq x23 \leq 0.2$) (trivalent cerium activated nitride phosphor)

The transparent silicone resin 162 may not be disposed (see FIG. 4(b)). Since the transparent silicone resin 162 is provided, a lens effect is obtained. Thus, it is possible to expect improvement of light extraction efficiency or narrowing of an angle of alignment characteristics in emission of light. In a case where the manufacturing process is desired to be more simplified or the alignment characteristics in emission of light are desired to have a wide angle, it is desirable that the transparent silicone resin 162 is not disposed. As described above, it is possible to increase the degree of freedom for the design of the light emitting apparatus B12 in accordance with whether or not the transparent silicone resin 162 is disposed. Thus, it is easier to obtain desired light emission characteristics in the light emitting apparatus B12.

[Application to Light Emitting Apparatus Such as Illumination Apparatus or Backlight Apparatus]

Since the light emitting apparatus B12 has the above-mentioned optical characteristics, it is possible to use the light emitting apparatus B12 as a light source of a light emitting apparatus. That is, the light emitting apparatus in the embodiment includes the light emitting apparatus B12. Thus, it is possible to provide the light emitting apparatus such as an illumination apparatus or a backlight apparatus, which has the above-mentioned optical characteristics. In the illumination apparatus or the backlight apparatus in the embodiment, configurations other than a light emitting apparatus can be used without being limited to a configuration of a known illumination apparatus or a known backlight apparatus in the related art.

Embodiment 5

A light emitting apparatus 1 in an embodiment of the present invention will be described with reference to FIGS. 5(a) and 5(b). FIG. 5(a) is a plan view schematically illustrating an example of a light emitting apparatus according to the embodiment of the present invention. FIG. 5(b) is a cross-sectional view obtained in a manner that the light emitting apparatus in FIG. 5(a) is cut off in a plane passing through a first light emitting element 6a, a second light emitting element 6b (in the following descriptions, the first light emitting element and the second light emitting element are collectively described as a light emitting element), and a wire 7. In FIG. 5(a), the light emitting apparatus 1 is illustrated in a state where the inside of the light emitting apparatus 1 is transparentized, in order to clarify a connection relationship between a wiring pattern 3 (3a, 3k) and the light emitting element 6a and a connection relationship between the light emitting elements, for example. In the embodiment, a Chip-on-Board (COB) type light emitting apparatus which uses a ceramic substrate and a Face-up type light emitting element is described. However, the form of the light emitting apparatus is not limited thereto. For example, aluminum or copper may be used as a substrate material. An upper and lower electrode type light emitting element or a Flip type light emitting element may be used as the light emitting element. In addition, the form of the light emitting apparatus may not be the COB type but be a surface mount (SMD) type in which a resin package formed by a metal frame is used as a substrate.

(Configuration of Light Emitting Apparatus)

The light emitting apparatus 1 includes a substrate 2, the wiring pattern 3 (3a, 3k) disposed on the substrate 2, an electrode land 4 (4a, 4k), a sealing resin layer 5, the first light emitting element 6a and the second light emitting element 6b, the wire 7, a printed resistor element 8, a resin dam 9, a green phosphor 10, and a red phosphor 12.

The resin dam 9 is provided on the upper surface of the substrate 2. The resin dam 9 is formed to have a ring shape (ring shape in plan view) when the substrate 2 is viewed from the upper part of the main surface. A sealing resin layer which includes the first light emitting element 6a and the second light emitting element 6b is provided at a portion of the upper surface of the substrate 2, which is positioned on an inner side of the resin dam 9.

The wiring patterns 3 (3a and 3k) are provided on the upper surface of the substrate 2 and are covered by the resin dam 9. The electrode lands 4 (4a and 4k) are provided at portions of the upper surface of the substrate 2 on an outer side of the resin dam 9. The wire 7 electrically connects the two kinds of the light emitting elements 6a and 6b with the wiring patterns 3 (3a and 3k). In a case where two or more light emitting elements 6 are provided, it is preferable that the light emitting elements 6 are connected to each other through the wire 7.

A specific example of the components of the light emitting apparatus 1 will be described below. Configurations (material, size, shape, or the like) of the substrate 2, the wiring patterns 3 (3a and 3k), the electrode lands 4 (4a and 4k), transparent resin included in the sealing resin layer 5, the light emitting element 6, the wire 7, the printed resistor element 8, and the resin dam 9 are not limited to the following descriptions.

(Substrate, Wiring Pattern, Electrode Land)

The substrate 2 is formed to have, for example, a rectangular shape in plan view. For example, the substrate 2 is a ceramic substrate or a metal substrate in which an insulating film is formed on the surface thereof.

The wiring patterns 3 (3a and 3k) are provided on the upper surface of the substrate 2 so as to face each other. Each of the wiring patterns 3 has a shape (arc shape) in which a portion of a ring is cut out, in plan view. Such wiring patterns 3 (3a and 3k) are formed, for example, by a screen printing method or the like.

The electrode lands 4 (4a and 4k) are electrodes for the external connection (for example, purpose for the supply of power) and are formed of Ag—Pt, for example. The electrode land 4a is connected to one end of the wiring pattern 3a through a drawing wire. The electrode land 4k is connected to one end of the wiring pattern 3k through another drawing wire. Such electrode lands 4 (4a and 4k) are formed, for example, by a screen printing method or the like.

(Sealing Resin Layer)

In the sealing resin layer 5, the green phosphor 10 and the red phosphor 12 are uniformly dispersed in transparent resin. Such a sealing resin layer 5 is formed in accordance with a method as follows. Firstly, the green phosphor 10 and the red phosphor 12 are uniformly mixed in transparent resin. The obtained mixture resin is injected into a portion of the upper surface of the substrate 2, which is positioned on an inner side of the resin dam 9. At this time, one or more of two kinds of the light emitting elements 6a and 6b have already been provided at the portion of the upper surface of the substrate 2, which is positioned on the inner side of the resin dam 9. In a case where two or more of the light emitting elements 6a and two or more of the light emitting elements 6b having a different kind from the light emitting elements 6a have been provided, two or more of the light emitting elements 6a and 6b have been connected to each other through the wire 7. Then, a heat treatment is performed. The transparent resin is cured by the heat treatment. As a result, the sealing resin layer 5 for sealing the two kinds of the light emitting elements 6, the green phosphor 10, and the red phosphor 12 is formed.

Any resin can be used as transparent resin included in the sealing resin layer 5, so long as the resin has the light-transmitting properties. Preferably, for example, epoxy resin, silicone resin, urea resin, and the like are used. The sealing resin layer 5 may include, for example, an additive such as $SiO_2$, $TiO_2$, $ZrO_2$, $Al_2O_3$, or $Y_2O_3$. If the sealing resin layer 5 includes such an additive, it is possible to prevent precipitation of the green phosphor 10, the red phosphor 12, or the like. In addition, it is possible to diffuse light from each of the light emitting elements 6a and 6b, the green phosphor 10, and the red phosphor 12 with high efficiency.

(Green Phosphor)

The green phosphor 10 is excited by primary light emitted from a light emitting element, so as to emit light having a peak emission wavelength in a green region. Here, "the green region" means a region in which a wavelength is 485 nm or longer and shorter than 580 nm.

Specific examples of the green phosphor 10 will be described below.

Phosphor represented by a general formula (A): $(M1)_{3-x}Ce_x(M2)_5O_{12}$ (in the formula, (M1) indicates at least one of Y, Lu, Gd, and La, (M2) indicates at least one of Al and Ga, and x indicating a composition ratio (concentration) of Ce satisfies $0.005 \leq x \leq 0.20$)

$Ca_3(Sc, Mg)_2Si_3O_{12}$:Ce-based phosphor,

Bivalent europium activated oxynitride phosphor which is β type SiAlON represented by a general formula (B): $Eu_aSi_bAl_cO_dN_e$ (in the formula, a satisfies $0.005 \leq a \leq 0.4$, b and c satisfy b+c=12, and d and e satisfy d+e=16), Bivalent europium activated silicate phosphor which is represented by a general formula (C): $(M3)_{2-y}Eu_ySiO_4$ (in the formula, (M3) indicates at least one of Mg, Ca, Sr, and Ba, and y indicating a component ratio (concentration) of Eu satisfies $0.03 \leq y \leq 0.10$), Trivalent cerium activated phosphor which is represented by a general formula (D): $La_{3-z}Ce_zSi_6N_{11}$ (in the formula, z satisfies $0.01 < z \leq 0.2$), (Ca, Sr, Ba)SiAl$_2$O$_3$N$_2$:Ce-based phosphor, Ba$_3$Si$_6$O$_{12}$N$_2$:Eu-based phosphor, (Sr, Ba)$_3$SiO$_5$:Eu-based phosphor.

As the green phosphor 10, one kind of the above-mentioned phosphors may be singly used or a mixture of two kinds or more thereof may be used. The green phosphor 10 may be produced in accordance with any producing method selected from known producing methods or may be obtained in a form of a product.

The half width of a fluorescence spectrum of the green phosphor 10 is preferably wide. For example, the half width thereof is preferably equal to or greater than 95 nm. A phosphor in which Ce is used as an activator, for example, a $Lu_{3-x}Ce_xAl_5O_{12}$-based green phosphor (phosphor when, in the general formula (A), (M1) is Lu and (M2) is Al) has a garnet crystal structure. Since the phosphor uses Ce as the activator, a fluorescence spectrum having a wide half width (half width is equal to or greater than 95 nm) is obtained. Thus, the phosphor which uses Ce as the activator is a green phosphor suitable for increasing the average color rendering index Ra of the light emitting apparatus 1.

(Red Phosphor)

The red phosphor 12 is excited by primary light emitted from a light emitting element, so as to emit light having a peak emission wavelength in a red region. Here, "the red region" means a region in which a wavelength is 580 nm or longer and shorter than 700 nm.

Specific examples of the red phosphor 12 will be described below.

(Sr, Ca)AlSiN$_3$:Eu-based phosphor,

CaAlSiN$_3$:Eu-based phosphor,

Bivalent europium activated nitride phosphor which is represented by a general formula (E): $(M6)_{2-x}Eu_xSi_5N_8$ (in the formula, (M6) indicates at least one of Mg, Ca, Sr, and Ba and x indicating a component ratio (concentration) of Eu satisfies $0.01 \leq x \leq 0.30$), Bivalent europium activated oxynitride phosphor which is α type SiAlON represented by a general formula (F): $[Eu_a(M7)_{1-a}]_xSi_bAl_cO_dN_e$ (in the formula, x satisfies $0.15 \leq x \leq 1.5$, a satisfies b and c satisfy b+c=12, d and e satisfy d+e=16, and (M7) indicates at least one of Li, Na, K, Rb, Cs, Mg, Ca, Sr, Ba, Sc, Y, La, and Gd), Tetravalent manganese activated fluoride metal salt phosphor which is represented by a general formula (G): $(M8)_2((M9)_{1-z}Mn_z)F_6$ (M8 indicates at least one of Li, Na, K, Rb, and Cs. M9 indicates at least one of Ge, Si, Sn, Ti, and Zr. $0.005 \leq z \leq 0.3$).

As the red phosphor 12, one kind of the above phosphors may be singly used or a mixture of two kinds or more thereof may be used. The red phosphor 12 may be produced in accordance with any producing method selected from known producing methods or may be obtained in a form of a product.

The half width of a fluorescence spectrum of the red phosphor 12 is preferably wide, similar to the green phosphor 10. Suitable examples of the red phosphor 12 can include a (Sr, Ca)AlSiN$_3$:Eu-based phosphor and a CaAlSiN$_3$:Eu-based phosphor.

A mixing ratio of the green phosphor 10 and the red phosphor 12 is not particularly limited. The mixing ratio thereof is preferably set to cause light emitted from the light emitting apparatus 1 to have desired characteristics.

(Light Emitting Element)

The light emitting apparatus 1 uses, as the light emitting element, the first light emitting element 6a that emits first primary light having a peak emission wavelength in a wavelength range of 440 nm or longer and shorter than 460 nm and the second light emitting element 6b that emits second primary light having a peak emission wavelength in a wavelength range of 460 nm to 490 nm. In particular, many phosphors used in a light emitting apparatus which uses an LED light source are excited in a wavelength range of 440 nm or longer and shorter than 460 nm, with high efficiency. Thus, if the first light emitting element 6a that emits the first primary light having a peak emission wavelength in the wavelength range of 440 nm or longer and shorter than 460 nm is used, this is advantageous because of improving emission efficiency of the light emitting apparatus. In addition, if the second light emitting element 6b that emits the second primary light having a peak emission wavelength in the wavelength range of 460 nm to 490 nm is used, as will be described later, the light emitting apparatus has an emitted light component in a wavelength region of 450 to 500 nm. Thus, this is advantageous because of improving the color rendering properties of the light emitting apparatus. Thus, it is possible to simultaneously maintain high emission efficiency and high color rendering properties of the light emitting apparatus 1. Accordingly, it is possible to improve practicality of the light emitting apparatus 1. In a case where a light emitting element having a peak emission wavelength of shorter than 440 nm is used, visibility may be bad and the light emitting element may not be suitable for excitation of a phosphor. For example, regarding the phosphor represented by the general formula (A), absorption efficiency of light from a light emitting element having a peak emission wavelength of shorter than 440 nm is bad and excitation efficiency is bad. Even in a case where a light emitting element having a peak emission wavelength of longer than 490 nm, the light emitting element may not be suitable for excitation of a phosphor. For example, regarding the phosphor represented by the general formula (A), absorption efficiency of light from a light emitting element having a peak emission wavelength of longer than 490 nm is bad.

An LED chip used as the first light emitting element 6a is preferably a bare chip of a semiconductor light emitting element that emits light which includes the first primary light having a peak emission wavelength in the wavelength range of 440 nm or longer and shorter than 460 nm, and is more preferably an InGaN-based LED chip. As one example of the first light emitting element 6a, an LED chip having a peak emission wavelength in the vicinity of 450 nm can be exemplified. Here, "the InGaN-based LED chip" means an LED chip in which a light-emitting layer is an InGaN layer.

An LED chip used as the second light emitting element 6b is preferably a bare chip of a semiconductor light emitting element that emits light which includes the second primary light having a peak emission wavelength in the wavelength range of 460 nm to 490 nm, and is more preferably an InGaN-based LED chip. As one example of the second light emitting element 6b, an LED chip having a peak emission wavelength in the vicinity of 470 nm can be exemplified.

In a case where the light emitting apparatus includes two or more of light emitting elements 6a and two or more of light emitting elements 6b, an arrangement form as follows is considered as an example of the arrangement form of the light emitting elements. The light emitting elements 6a and 6b are die-bonded to the upper surface of the substrate 2. The light emitting elements 6a and 6b are disposed on a straight line so as to be substantially parallel to one side of the substrate 2 (side of the substrate 2, which extends in an X direction). The light emitting elements 6a and 6b are arranged at a portion of the upper surface of the substrate 2, which is positioned on an inner side of the resin dam 9, with high density. Specifically, the light emitting elements 6a and 6b are arranged such that the number of the light emitting elements 6a and 6b which are arranged on a straight line in the vicinity of the center of a ring defined by the resin dam 9 is large and the number of the light emitting elements 6a and 6b which are arranged on a straight line is reduced from the center of the ring toward the peripheral edge of the substrate 2 (on an outside of the ring in a diameter direction thereof).

In the light emitting apparatus 1 illustrated in FIG. 5, a wiring is formed in a manner that 8 first light emitting elements 6a and 4 second light emitting elements are connected to each other through wires 7. 10 lines of the wiring are connected in parallel, between the electrode lands 4 (4a and 4b). The first light emitting elements 6a and the second light emitting elements 6b are arranged without being concentrated, so as to cause light emitted from the light emitting apparatus to be uniformly emitted. A ratio of the number of the first light emitting elements 6a and the number of the second light emitting elements 6b is not particularly limited.

It is preferable that the light emitting elements 6a and 6b have a structure in which light is emitted from the upper surface thereof. It is preferable that each of the light emitting elements 6a and 6b has an electrode pad for connecting light emitting elements which are adjacent to each other, and an electrode pad (for example, anode electrode pad and cathode electrode pad) for connecting the light emitting elements 6a and 6b with the wiring patterns 3 (3a and 3k), through the wires 7.

The light emitting elements 6a and 6b may have a structure in which light is emitted from the lower surface thereof. In this case, firstly, a wire corresponding to the wire 7 and the electrode land 4 are formed on the upper surface of the substrate 2. Then, the electrode pads provided on the surfaces of the light emitting elements 6a and 6b oppose the upper surface of the substrate 2 and connect the light emitting elements 6a and 6b with the substrate 2 by a flip chip connection through a bump. In this manner, the light emitting elements 6a and 6b having a structure in which light is emitted from the lower surface can be mounted on the upper surface of the substrate 2.

(Resistor Element)

The resistor element 8 is provided for increasing an electrostatic breakdown voltage. The resistor element 8 is provided to connect one end of the wiring pattern 3a with one end of the wiring pattern 3k, as illustrated in FIG. 5. The resistor element 8 has a shape (arc shape) in which a portion of a ring is cut out. Such a resistor element 8 is preferably a printed resistor or a zener diode, for example. The light emitting apparatus 1 may not include the resistor element 8.

(Resin Dam)

The resin dam 9 is resin for damming the sealing resin layer 5. The resin dam 9 is preferably configured by a colored material (white material or milky white material is preferable). As illustrated in FIG. 5(*b*), it is preferable to form the resin dam 9 to cover an annular portion which is formed by the wiring pattern 3 and the printed resistor element 8, because absorption, by the wiring pattern 3 and the printed resistor element 8, of light emitted from the light emitting elements or light converted by the phosphor can be reduced.

(Light Emission Characteristic of Light Emitting Apparatus, Emission Spectrum of Light Emitting Apparatus)

The light emitting apparatus 1 includes at least one first light emitting element 6a, at least one second light emitting element 6b, the green phosphor 10, and the red phosphor 12. The first light emitting element 6a emits first primary light having a peak emission wavelength in the wavelength range of 440 nm or longer and shorter than 460 nm. The second light emitting element 6b emits second primary light having a peak emission wavelength in the wavelength range of 460 nm to 490 nm. The green phosphor 10 is excited by the primary light emitted from the light emitting elements 6a and 6b, so as to emit light having a peak emission wavelength in a green region. The red phosphor 12 is excited by the primary light emitted from the light emitting elements 6a and 6b, so as to emit light having a peak emission wavelength in a red region. Light emitted from the light emitting apparatus 1 has a correlated color temperature of 2000 K to 6500 K and has an average color rendering index Ra of 80 or greater. That is, light emitted from the light emitting apparatus 1 has a high average color rendering index Ra and excellent color rendering properties. Here, "the correlated color temperature" indicates a value obtained based on JIS Z 8725 (measuring method of a distribution temperature and a color temperature•correlated color temperature of a light source). "The average color rendering index" indicates a value obtained based on JIS Z 8726:1990 (evaluating method of color rendering properties of a light source).

Figure 6:
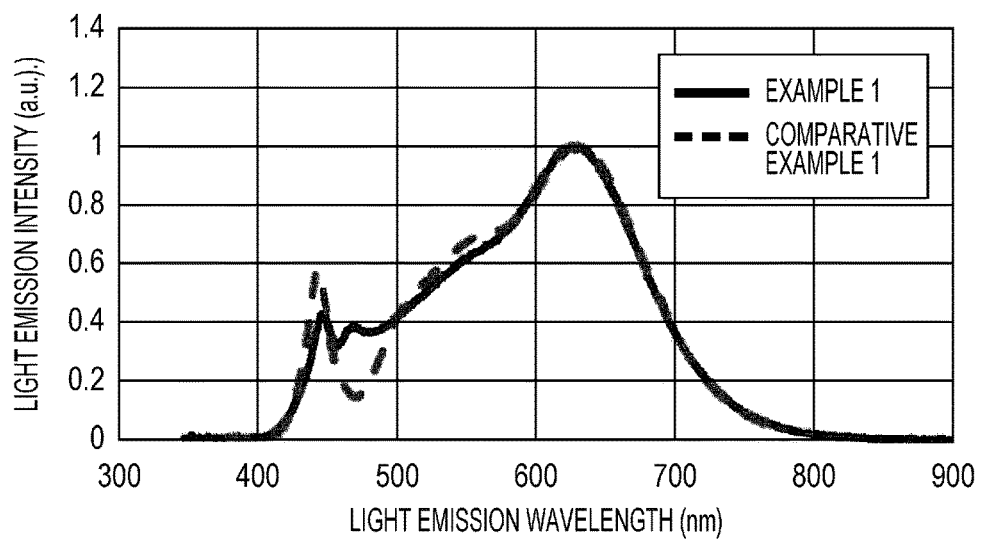
FIG. 6 is a diagram illustrating emission spectra of light emitting apparatuses of Example 1 and Comparative Example 1.

The light emitting apparatus 1 includes the two kinds of the light emitting elements 6a and 6b which are different from each other. Thus, in a case where a white irradiation target is irradiated with light from the light emitting apparatus 1, it is possible to reduce the blue reflection component, and thus reproducibility of the white, black, red, and navy colors is improved. The reason will be described with reference to FIG. 6. FIG. 6 illustrates emission spectra of two kinds of light emitting apparatuses which are different from each other. In FIG. 6, in Example 1, there is provided a light emitting apparatus which has a configuration similar to that of the light emitting apparatus according to the embodiment. The light emitting apparatus in Example 1 includes a first light emitting element and a second light emitting element. The first light emitting element emits first primary light having a peak emission wavelength in the wavelength range of 440 nm or longer and shorter than 460 nm. The second light emitting element emits second primary light having a peak emission wavelength in the wavelength range of 460 nm to 490 nm. In Comparative Example 1, there is provided a light emitting apparatus which has a configuration similar to that in Example 1 except that only the first light emitting element is used as a light emitting element and the second light emitting element is not used.

As illustrated in FIG. 6, in a case (Comparative Example 1) where the light emitting apparatus includes only one kind of light emitting element, the spectrum of light emitted by the light emitting apparatus has one sharp peak in a wavelength range of 430 nm to 480 nm. Thus, in a case where a white irradiation target is irradiated with light from the light emitting apparatus, the blue reflection component is largely provided. Accordingly, the white color looks excessively bluish-white, the black color looks bluish, the red color looks like a color which is close to purple, and the navy color looks bluish. That is, reproducibility of the colors is not favorable.

Meanwhile, in a case (Example 1) where the light emitting apparatus includes two kinds of light emitting elements, the spectrum of light emitted by the light emitting apparatus has two small peaks in a wavelength range of 430 nm to 500 nm. A difference between the largest light emission intensity of one peak having the large largest light emission intensity and the smallest light emission intensity of a valley portion between the two peaks is smaller than a difference between the largest light emission intensity of a peak in the vicinity of 450 nm and the smallest light emission intensity of a valley portion on a side of a long wavelength from the peak in Comparative Example 1. Thus, in a case where a white irradiation target is irradiated with light from the light emitting apparatus, the blue reflection component can be reduced. Accordingly, reproducibility of the white, black, red, and navy colors is favorable. Thus, the light emitting apparatus according to the embodiment can be suitably used for, for example, sales of products, and, particularly, can be suitably used in the clothing industry. Further, in the light emitting apparatus of the present invention, an emitted light component in the wavelength region of 440 nm or longer and shorter than 460 nm is relatively small in comparison to a light emitting apparatus in the related art, which uses an LED. Thus, the light emitting apparatus of the present invention has features that it is possible to suppress fading of an irradiation target and that a degree of an injury to the retina of an eye of a person is small.

In the spectrum of light emitted from the light emitting apparatus 1 (emission spectrum of the light emitting apparatus 1), the smallest light emission intensity in a wavelength range of 450 nm to 500 nm is set to be first light emission intensity E1, the largest light emission intensity in a wavelength range of 430 nm or longer and shorter than 460 nm is set to be second light emission intensity E2, and a ratio (E2/E1) of the second light emission intensity E2 to the first light emission intensity E1 is preferably equal to or smaller than 3.0. If the ratio thereof is set to be equal to or smaller than 3.0, the light emitting apparatus has very high reproducibility of the white, black, red, and navy colors. The ratio (E2/E1) of the first light emission intensity E1 and the second light emission intensity E2 is more preferably equal to or smaller than 2.5 and further preferably equal to or smaller than 2.0.

As a specific method for obtaining such an emission spectrum, a method in which materials or contents of the light emitting elements 6a and 6b, the green phosphor 10, and the red phosphor 12 are optimized is exemplified.

EXAMPLES

The present invention will be more specifically described below by using examples. However, the present invention is not limited thereto.

Example 1

A light emitting apparatus in Example 1 has a configuration similar to that of the light emitting apparatus illustrated in FIG. 5. The light emitting apparatus in Example 1 includes 80 of first light emitting elements that emit first primary light having a peak emission wavelength in a wavelength range of 440 nm or longer and shorter than 460 nm, and 40 of second light emitting elements that emit second primary light having a peak emission wavelength in a wavelength range of 460 nm to 490 nm. A mixing ratio between the green phosphor and the red phosphor is adjusted so as to cause the correlated color temperature of light emitted from the light emitting apparatus to be in the vicinity of 3000 K.

Examples 2 to 4

Each of light emitting apparatuses in Examples 2 to 4 has a configuration similar to that in Example 1 except that the number of first light emitting elements, the number of second light emitting elements, and the correlated color temperature of light emitted from the light emitting apparatus are set to be values shown in Table 1.

Comparative Examples 1 to 4

Each of light emitting apparatuses in Comparative Examples 1 to 4 has a configuration similar to that in Example 1 except that 120 of first light emitting elements are used as the light emitting element, the second light emitting element is not used, and the correlated color temperature of light emitted from the light emitting apparatus is set to be a value shown in Table 1.

<Performance Evaluation>

FIGS. 6 to 9 illustrate emission spectra of the light emitting apparatuses in Examples 1 to 4 and Comparative Examples 1 to 4.

Regarding the light emitting apparatus of each of Examples 1 to 4 and Comparative Examples 1 to 4, the first light emission intensity E1 which is the smallest light emission intensity in the wavelength range of 450 nm to 500 nm, and the second light emission intensity E2 which is the largest light emission intensity in the wavelength range of 430 nm to 460 nm were obtained. The ratio (E2/E1) of the second light emission intensity E2 to the first light emission intensity E1 was calculated. The correlated color temperature of light emitted from the light emitting apparatus, and the average color rendering index Ra and the special color rendering index R9 were obtained. "The correlated color temperature" was obtained based on JIS Z 8725 (measuring method of a distribution temperature and a color temperature•correlated color temperature of a light source). "The average color rendering index" was obtained based on JIS Z 8726:1990 (evaluating method of color rendering properties of a light source). Table 1 shows results.

TABLE 1

|  | First light emitting element (pieces) | Second light emitting element (pieces) | Correlated color temperature (K) | Average color rendering index Ra | Special color rendering index R9 | Second light emission intensity/first light emission intensity (E2/E1) |
| --- | --- | --- | --- | --- | --- | --- |
| Example 1 | 80 | 40 | 3000 | 97 | 98 | 1.4 |
| Example 2 | 80 | 40 | 2700 | 97 | 95 | 1.3 |
| Example 3 | 80 | 40 | 4000 | 98 | 96 | 1.5 |
| Example 4 | 80 | 40 | 6500 | 97 | 99 | 1.8 |
| Comparative Example 1 | 120 | 0 | 3000 | 95 | 88 | 4.1 |
| Comparative Example 2 | 120 | 0 | 2700 | 94 | 85 | 3.5 |
| Comparative Example 3 | 120 | 0 | 4000 | 92 | 78 | 4.0 |
| Comparative Example 4 | 120 | 0 | 6500 | 86 | 56 | 5.4 |

As illustrated in FIG. 6, the emission spectrum in Example 1 has two small peaks in the wavelength range of 430 nm to 500 nm. The emission spectrum in Comparative Example 1 has one sharp peak in the wavelength range of 430 nm to 500 nm. The light emitting apparatus in Example 1 had a high average color rendering index Ra, a high special color rendering index R9, and favorable reproducibility of the white, red, navy, and black colors, in comparison to the light emitting apparatus in Comparative Example 1.

Figure 7:
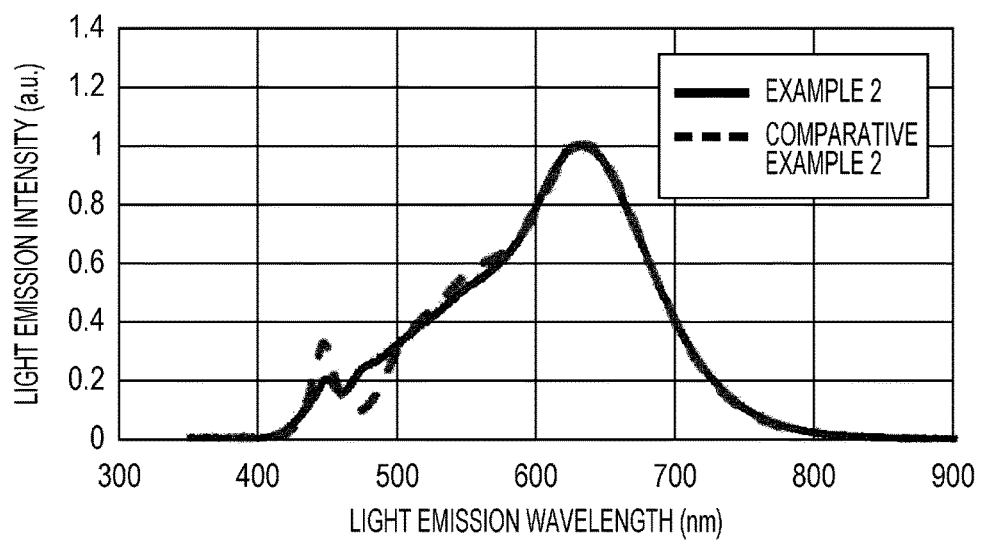
FIG. 7 is a diagram illustrating emission spectra of light emitting apparatuses of Example 2 and Comparative Example 2.
Figure 8:
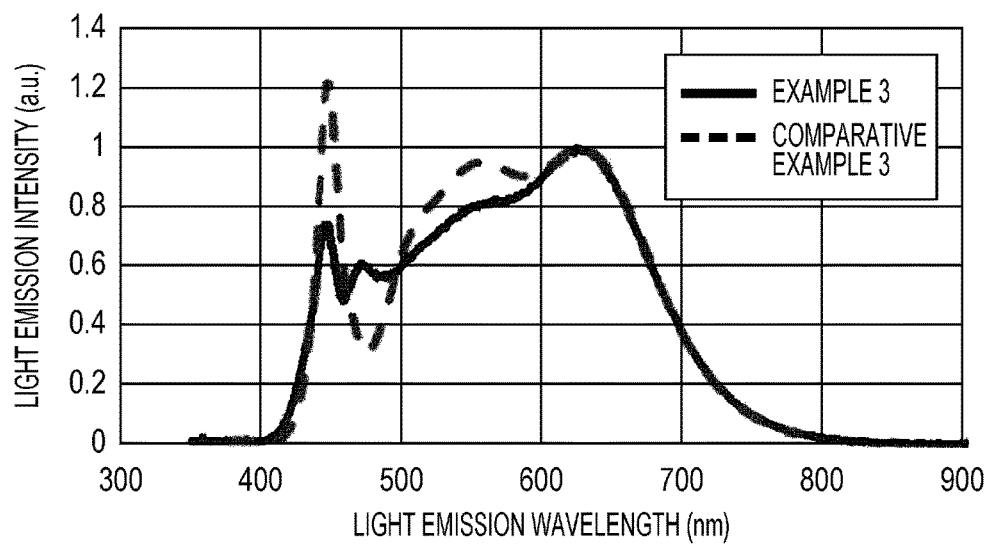
FIG. 8 is a diagram illustrating emission spectra of light emitting apparatuses of Example 3 and Comparative Example 3.
Figure 9:
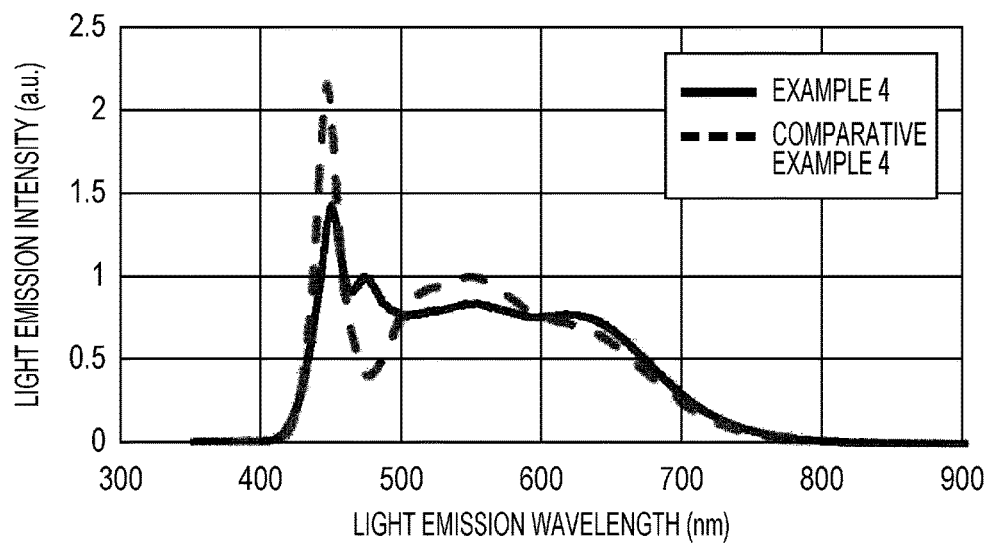
FIG. 9 is a diagram illustrating emission spectra of light emitting apparatuses of Example 4 and Comparative Example 4.

As illustrated in FIGS. 7 to 9, the emission spectrum in each of Examples 2 to 4 has two small peaks in the wavelength range of 430 nm to 500 nm. The emission spectrum in each of Comparative Examples 2 to 4 has one sharp peak in the wavelength range of 430 nm to 500 nm. The light emitting apparatus in each of Examples 2 to 4 had a high average color rendering index Ra, a high special color rendering index R9, and favorable reproducibility of the white, red, navy, and black colors, in comparison to the light emitting apparatus in each of Comparative Examples 2 to 4.

It should be considered that the embodiments and the examples disclosed herein are just examples in all points and it is not limited thereto. The scope of the present invention is shown by not the above-described embodiments but by claims, and it is intended that all changes within the meaning and the scope which are equivalent to the claims are included.

REFERENCE SIGNS LIST

1, A11, A12, B11, B12 LIGHT EMITTING APPARATUS
2, A111, B112 SUBSTRATE
A112, B111 FRAME
3 (3a, 3k) WIRING PATTERN
4 (4a, 4b) ELECTRODE LAND
5 SEALING RESIN LAYER
6a, A101, B101 FIRST LIGHT EMITTING ELEMENT
6b, B102 SECOND LIGHT EMITTING ELEMENT
7 WIRE
8 PRINTED RESISTOR ELEMENT
9 RESIN DAM
10, 181 GREEN PHOSPHOR
12, 191 RED PHOSPHOR
121 FIRST ELECTRODE LAND
122 SECOND ELECTRODE LAND
A129, A130, B129, B130 ELECTRODE
151 DAM RING
160 FIRST PHOSPHOR-CONTAINING RESIN LAYER
161 RESIN
162 SILICONE RESIN
201 BLUE PHOSPHOR
260 SECOND PHOSPHOR-CONTAINING RESIN LAYER

The invention claimed is:
1. A light emitting apparatus comprising:
a substrate;
a dam ring which is provided on an upper surface of the substrate and has an annular shape;
at least one light emitting element that emits both first primary light having a peak emission wavelength in a wavelength range of 440 nm or longer and shorter than 460 nm and second primary light having a peak emission wavelength in a wavelength range of 460 nm to 490 nm; and
a phosphor,
wherein the phosphor is either of a phosphor which includes a green phosphor that is excited by either or both of the first primary light and the second primary light and emits first fluorescent light having a peak emission wavelength in a green region and a red phosphor that is excited by either or both of the first primary light and the second primary light and emits second fluorescent light having a peak emission wavelength in a red region, and a phosphor which includes the green phosphor that emits the first fluorescent light, the red phosphor that emits the second fluorescent light, and a blue phosphor that is excited by either or both of the first primary light and the second primary light and emits third fluorescent light having a peak emission wavelength in a blue region,
in an emission spectrum of the light emitting apparatus, first light emission intensity E1 is smallest light emission intensity in a wavelength range of 450 nm to 500 nm, second light emission intensity E2 is largest light emission intensity in a wavelength range of 430 nm to 460 nm, and a ratio (E2/E1) of the second light emission intensity E2 to the first light emission intensity E1 is equal to or smaller than 3.0,
light having a correlated color temperature of 2000 K to 6500 K and having an average color rendering index Ra which is equal to or greater than 97 even at any correlated color temperature in a range of 2000 K to 6500 K is emitted, and
the light emitting elements are arranged at an equal interval in a region surrounded by the dam ring on the upper surface of the substrate.

2. A light emitting apparatus comprising:

a substrate;

a resin dam which is provided on an upper surface of the substrate and has an annular shape;

at least two of first light emitting elements that emit first primary light having a peak emission wavelength in a wavelength range of 440 nm or longer and shorter than 460 nm;

at least two of second light emitting elements that emit second primary light having a peak emission wavelength in a wavelength range of 460 nm to 490 nm; and a phosphor, wherein the phosphor is either of a phosphor which includes a green phosphor that is excited by either or both of the first primary light and the second primary light and emits first fluorescent light having a peak emission wavelength in a green region and a red phosphor that is excited by either or both of the first primary light and the second primary light and emits second fluorescent light having a peak emission wavelength in a red region, and a phosphor which includes the green phosphor that emits the first fluorescent light, the red phosphor that emits second fluorescent light, and a blue phosphor that is excited by either or both of the first primary light and the second primary light and emits third fluorescent light having a peak emission wavelength in a blue region, in an emission spectrum of the light emitting apparatus, first light emission intensity E1 is smallest light emission intensity in a wavelength range of 450 nm to 500 nm, second light emission intensity E2 is largest light emission intensity in a wavelength range of 430 nm to 460 nm, and a ratio (E2/E1) of the second light emission intensity E2 to the first light emission intensity E1 is equal to or smaller than 3.0, light having a correlated color temperature of 2000 K to 6500 K and having an average color rendering index Ra which is equal to or greater than 97 even at any correlated color temperature in a range of 2000 K to 6500 K is emitted, and the first light emitting elements and the second light emitting elements are disposed at a portion of the upper surface of the substrate, which is positioned on an inner side of the resin dam, with high density.

3. The light emitting apparatus according to claim 1, wherein the green phosphor is one or a plurality of phosphors selected from the following A group, and the red phosphor is one or a plurality of phosphors selected from the following B group, (A group)

(A1) β type SiAlON which is represented by a general formula $Eu_{a1} Si_{b1} Al_{c1} O_{d1} N_{e1}$ ($0.001 \leq a1 \leq 0.2$)

(A2) Phosphor which is represented by $(MI)_{3-x2}Ce_{x2}(MII)_5O_{12}$ (MI indicates at least one of Lu, La, and Gd, MII indicates at least one of Al and Ga. $0.005 \leq x2 \leq 0.3$) and has a garnet type crystal structure (A3) Phosphor represented by $(MIII)_{3-x4}Ce_{x4}(MIV)_2Si_3O_{12}$ (MIII indicates at least one of Mg, Ca, Sr, and Ba, MIV indicates at least one of Li, Na, K, Cs, Rb, Mg, Ca, Ba, Al, Ga, In, Sc, Y, La, Gd, and Lu. $0.005 \leq x4 \leq 0.3$)

(A4) Phosphor represented by $(MV)_{3-a7}Eu_{a7}Si_6O_{12}N_2$ (MV indicates at least one of Sr and Ba. $0.005 \leq a7 \leq 0.2$)

(B group)

(B1) Phosphor represented by $(MIII)_{1-x11}Eu_{x11}(MVI)SiN_3$ (MIII indicates at least one of Mg, Ca, Sr, and Ba, MVI indicates at least one of Al, Ga, In, Sc, Y, La, Gd, and Lu. $0.005x11 \leq 0.2$)

(B2) Phosphor represented by $(MIII)_{2-x12}Eu_{x12}Si_5N_8$ (MIII indicates at least one of Ca and Sr. $0.005 \leq x12 \leq 0.2$)

(B3) α type SiAlON which is represented by $Eu_f(MVII)_g Si_h Al_i O_j N_k$ (MVII indicates at least one of Li, Na, K, Rb, Cs, Mg, Ca, Sr, Ba, Sc, Y, La, and Gd. $0.001 \leq f \leq 0.2$)

(B4) Phosphor represented by $(MVIII)_2((MIX)_{1-x14}Mn_{x14})F_6$ (MVIII indicates at least one of Li, Na, K, Rb, and Cs, MIX indicates at least one of Ge, Si, Sn, Ti, and Zr. $0.005 \leq x14 \leq 0.3$).

* * * * *

UNITED STATES PATENT AND TRADEMARK OFFICE
CERTIFICATE OF CORRECTION

PATENT NO. : 10,374,133 B2
APPLICATION NO. : 15/562770
DATED : August 6, 2019
INVENTOR(S) : Kazuaki Kaneko et al.

It is certified that error appears in the above-identified patent and that said Letters Patent is hereby corrected as shown below:

On the Title Page

At item (87), please correct the PCT Pub. No.:
"WO2015/159141" to --WO2016/159141--.

Signed and Sealed this
Seventh Day of April, 2020

Andrei Iancu
*Director of the United States Patent and Trademark Office*